United States Patent
Ichiki et al.

(10) Patent No.: US 7,314,574 B2
(45) Date of Patent: *Jan. 1, 2008

(54) ETCHING METHOD AND APPARATUS

(75) Inventors: Katsunori Ichiki, Kanagawa (JP);
Kazuo Yamauchi, Kanagawa (JP);
Hirokuni Hiyama, Kanagawa (JP);
Seiji Samukawa, Miyagi (JP)

(73) Assignee: Ebara Corporation, Tokyo (JP)

( * ) Notice: Subject to any disclaimer, the term of this patent is extended or adjusted under 35 U.S.C. 154(b) by 13 days.

This patent is subject to a terminal disclaimer.

(21) Appl. No.: 10/484,502

(22) PCT Filed: Sep. 24, 2002

(86) PCT No.: PCT/JP02/09748

§ 371 (c)(1),
(2), (4) Date: Aug. 9, 2004

(87) PCT Pub. No.: WO03/030240

PCT Pub. Date: Apr. 10, 2003

(65) Prior Publication Data

US 2005/0020070 A1    Jan. 27, 2005

(30) Foreign Application Priority Data

Sep. 28, 2001    (JP) .............................. 2001-302538

(51) Int. Cl.
*B44C 1/22*    (2006.01)
*H01L 21/00*    (2006.01)
(52) U.S. Cl. ................. 216/67; 216/66; 216/71; 216/79; 438/710; 438/719
(58) Field of Classification Search ............... 216/67, 216/71, 94; 250/492.3; 204/192.3–192.34; 438/706, 710, 719
See application file for complete search history.

(56) References Cited

U.S. PATENT DOCUMENTS

| | | | | |
|---|---|---|---|---|
| 4,259,145 A | * | 3/1981 | Harper et al. ................ | 438/712 |
| 4,406,733 A | | 9/1983 | Tachi | |
| 4,450,031 A | * | 5/1984 | Ono et al. ............. | 156/345.39 |
| 4,486,665 A | * | 12/1984 | Leung et al. ................ | 250/427 |
| 4,523,971 A | * | 6/1985 | Cuomo et al. ......... | 156/345.39 |
| 5,110,407 A | | 5/1992 | Ono et al. | |

(Continued)

FOREIGN PATENT DOCUMENTS

WO    WO 01/84611    11/2001

*Primary Examiner*—Shamim Ahmed
(74) *Attorney, Agent, or Firm*—Westerman, Hattori, Daniels & Adrian, LLP.

(57) ABSTRACT

An etching apparatus comprises a workpiece holder (21) for holding a workpiece (X), a plasma generator (10, 20) for generating a plasma (30) in a vacuum chamber (3), an orifice electrode (4) disposed between the workpiece holder (21) and the plasma generator (10, 20), and a grid electrode (5) disposed upstream of the orifice electrode (4) in the vacuum chamber (3). The orifice electrode (4) has orifices (4a) defined therein. The etching apparatus further comprises a voltage applying unit (25, 26) for applying a voltage between the orifice electrode (4) and the grid electrode (5) to accelerate ions from the plasma (30) generated by the plasma generator (10, 20) and to pass the extracted ions through the orifices (4a) in the orifice electrode (4), for generating a collimated neutral particle beam having an energy ranging from 10 eV to 50 eV.

16 Claims, 4 Drawing Sheets

U.S. PATENT DOCUMENTS

| | | |
|---|---|---|
| 5,395,474 A | 3/1995 | Suzuki et al. |
| 5,462,629 A * | 10/1995 | Kubota et al. ......... 156/345.55 |
| 5,518,572 A | 5/1996 | Kinoshita et al. |
| 5,783,100 A * | 7/1998 | Blalock et al. ............... 216/67 |
| 2001/0018271 A1 | 8/2001 | Yanagisawa |
| 2001/0021422 A1 * | 9/2001 | Yamakoshi et al. ......... 427/569 |

* cited by examiner

ETCHING METHOD AND APPARATUS

TECHNICAL FIELD

The present invention relates to an etching method and apparatus suitable for use in micromachining processes involved in the fabrication of semiconductor devices or the like, and more particularly to an etching method and apparatus for processing a surface of a workpiece with use of a neutral particle beam generated by neutralizing positive or negative ions generated in a plasma.

BACKGROUND ART

In recent years, semiconductor integrated circuits, micromachines, and the like have been processed in highly fine patterns. Therefore, a highly accurate process and a process to form a high aspect ratio pattern are required. In the fields of such processing, there has widely been used a plasma etching apparatus.

As a plasma etching apparatus, there has been known a reactive ion etching (RIE) apparatus which generates various kinds of particles including positive ions and radicals. The positive ions or the radicals are applied to a workpiece to etch the workpiece.

In an etching process utilizing such an RIE apparatus, there have been problems that high accuracy and high selectivity cannot be achieved simultaneously and etching profile irregularities are caused by charge build-up. The selectivity is a ratio of the etched depth in a workpiece to the etched depth in a mask or an underlying material. Specifically, when a workpiece is etched by x μm and a mask protecting the workpiece is etched by y μm, the selectivity s is expressed by s=x/y. In the case of a higher selectivity, the mask is less damaged and the workpiece can be etched to form a pattern having a high aspect ratio.

In order to enhance the selectivity, a combination of gases which can deposit on the mask or the underlying material but can etch the workpiece has been used in the conventional etching process. Further, radicals deposit onto the surface of the workpiece to form a sidewall passivation layer. If the sidewall passivation layer is excessively formed on the surface of the workpiece, then the surface of the workpiece is processed into a tapered shape, so that dimensional accuracy is lowered in the etching process. When a combination of $Cl_2$ gas and $O_2$ gas is used in the conventional etching process, the selectivity of $Si/SiO_2$ is at most about 100. Thus, this combination of gases can achieve a higher selectivity than other combinations of gases. However, devices having a pattern smaller than 0.1 μm have been required to be processed with high accuracy and a selectivity higher than 300. Particularly, it will be the future task to simultaneously achieve a higher selectivity over an underlying layer of a gate oxide film and no residue at step portions for isolation.

The etching profile irregularities are caused by the difference between the behavior of electrons and that of positive ions. Specifically, the etching profile irregularities, i.e., notches, are produced at sidewalls defining stripes of a fine pattern. When the etching process is performed with a low energy ion beam, electrons are decelerated within the fine pattern by a negative self-bias potential on the substrate, and trapped near a resist. On the other hand, ions are accelerated and delivered to the underlying layer of the oxide film to develop positive charge build-up on the substrate. However, at the outside of the fine pattern, charge build-up doesn't occur because the same amounts of electrons and ions are delivered thereto. Thus, a potential difference is produced between the inside and outside of the fine pattern, so that the trajectories of the ions are curved to produce the notches.

DISCLOSURE OF INVENTION

The present invention has been made in view of the above drawbacks. It is therefore an object of the present invention to provide an etching method and apparatus which can etch a surface of a workpiece without charge build-up or etching profile irregularities on the workpiece, and can simultaneously achieve high accuracy and high selectivity for a fine pattern.

According to an aspect of the present invention, there is provided an etching method comprising: generating a collimated neutral particle beam having an energy ranging from 10 eV to 50 eV from a gas; and applying the neutral particle beam to a surface of a workpiece to etch the surface of the workpiece.

According to the present invention, the workpiece can be processed by the collimated neutral particle beam having no electric charges but having a large translational energy. Therefore, the workpiece can highly accurately be etched in such a state that an amount of charge build-up is reduced. Further, since the collimated neutral particle beam is applied to the workpiece, the workpiece can highly accurately be etched even in the case where a sidewall passivation layer is not formed on the surface of the workpiece. When the neutral particle beam has an energy of 50 eV or lower, a resist is hardly sputtered by the neutral particle beam. Therefore, the workpiece can be etched with high selectivity.

When an ion beam having a low energy is applied to the workpiece in a conventional RIE apparatus, notches may be produced as local etching profile irregularities. According to the present invention, however, since the etching method utilizes a neutral particle beam, it is possible to etch the workpiece to form a pattern having a high aspect ratio without generating notches. Thus, according to the present invention, it is possible to simultaneously achieve high accuracy and high selectivity for a fine pattern.

It is desirable that the neutral particle beam has an energy ranging from 10 eV to 50 eV. With the neutral particle beam having a low energy, the workpiece can be etched with high accuracy. For example, in the case of Si etching, since the ratio of sputtering yields of Si and $SiO_2$ is increased with the neutral particle beam having an energy of 50 eV or lower, the selectivity can be enhanced.

According to a preferred aspect of the present invention, the generating comprises neutralizing negative ions to generate the neutral particle beam. In this case, the negative ions can be generated by use of a pulse-time-modulated plasma, for example.

Generally, it is difficult to generate a complete neutral particle beam, and the generated beam includes a residual ion beam. While the ions can be removed by a deflector, the deflector lengthens the distance between the beam source and the workpiece and also makes the apparatus complicated. When the positive ions are applied to the workpiece, charge build-up is developed on the substrate. It has been known in the art that negative ions apply a lower charge build-up voltage on the surface of the workpiece in comparison with positive ions. Therefore, even if negative ions are included as residual ions in the generated beam, the charge build-up voltage is low. Accordingly, by selectively extracting and neutralizing only the negative ions and applying the neutralized beam to the workpiece, it is possible to process the workpiece with less charge build-up damage in micromachining processes involved in the fabrication of a semiconductor device or the like.

According to a preferred aspect of the present invention, the neutral particle beam includes fluorine atoms or chlorine atoms. In the conventional etching method, when a gas such as $SF_6$ from which fluorine is dissociated is used, fluorine spontaneously reacts with Si due to thermal excitation. Therefore, the workpiece is isotropically etched, so that the accuracy of the process is lowered. According to the present invention, however, since the neutral particle beam is collimated, the beam is unlikely to collide with the sidewall and hence the sidewalls are prevented from being etched even in the case of use of the fluorine neutral particle beam. Thus, it is possible to employ a gas having a high reactivity to enhance the etching rate. Further, since the workpiece can highly accurately be etched without the sidewall passivation wall, it is not necessary to add an additive gas for forming a sidewall passivation layer into the process gas.

According to a preferred aspect of the present invention, the etching method further comprises: separating a beam generating chamber for generating the neutral particle beam from a process chamber in which the workpiece is disposed; and setting the pressure of the process chamber to be lower than the pressure of the beam generating chamber. It is desirable that the pressure of the process chamber is set to be not more than 0.1 Pa.

If the pressure of the process chamber in which the workpiece is disposed is low, then the probability that the residual gas or radicals are applied to the workpiece is reduced, and the workpiece can be processed with a collimated beam. Therefore, the amount of deposited film can be reduced, and hence the workpiece can be processed highly accurately. In order to generate a plasma, the pressure should be at least about 1 Pa, even with an ICP which can perform electric discharge at a low pressure. As described above, the beam generating chamber for generating the neutral particle beam is separated from the process chamber in which the workpiece is disposed, so that the pressure of the process chamber can be reduced to process the workpiece highly accurately.

According to a preferred aspect of the present invention, the collimated neutral particle beam is generated through an orifice plate having orifices defined therein. The orifice plate having orifices defined therein can collimate the neutral particle beam and simultaneously separate the beam generating chamber and the process chamber from each other. Since the generated plasma is isolated from the workpiece by the orifice plate, a radiation produced by the plasma is prevented from being applied to the workpiece. Therefore, it is possible to reduce adverse effects on the workpiece due to the radiation such as an ultraviolet ray which would otherwise damage the workpiece.

It is desirable that a distance between the orifice plate and the workpiece is set to be in the range from 2 mm to 50 mm. With this arrangement, the beam does not collide with other molecules at a pressure region of about 0.1 Pa. Therefore, the number of neutral particles applied to the workpiece can be increased, and hence the etching rate can be enhanced.

Figure 1:
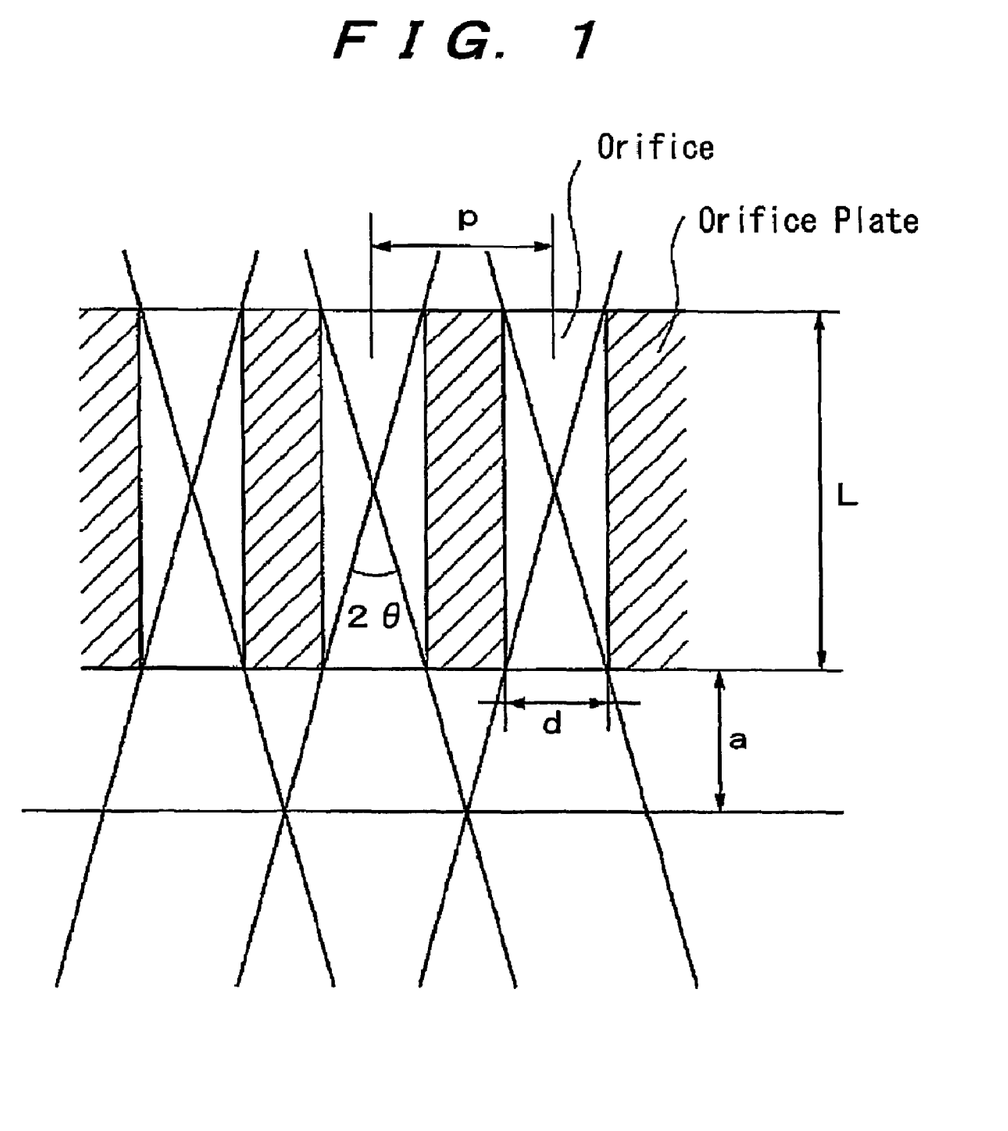
FIG. 1 is a vertical cross-sectional view explanatory of a distance between an orifice plate and a workpiece in an etching apparatus according to the present invention.

More specifically, if the distance between the orifice plate and the workpiece is set to be shorter than 2 mm, then the workpiece is not uniformly etched. The workpiece is etched deeply at portions located below the orifices in the orifice plate, and is hardly etched at portions located between the orifices. FIG. 1 is a cross-sectional view showing the orifice plate. Typically, in the actual orifice plate, the orifice has a diameter d of 1 mm and a length L of 10 mm, and the orifices are arranged with a pitch p of 1.4 mm. With such an orifice plate, the angle θ of beam divergence is defined by tan θ=d/L. If the distance between the orifice plate and the workpiece is shorter than the distance "a" indicated in FIG. 1, then there are regions to which the beam is not applied. The distance. "a" is expressed by the following equations.

$$a = \frac{p-d}{2} \cdot \frac{1}{\tan\theta}$$
$$= \frac{p-d}{2} \cdot \frac{L}{d}$$
$$= \frac{1.4-1}{2} \cdot \frac{10}{1}$$
$$= 2 \text{ (mm)}$$

Therefore, if the distance between the orifice plate and the workpiece is shorter than 2 mm, then the workpiece cannot be etched uniformly. Accordingly, it is desirable that the distance between the orifice plate and the workpiece should be 2 mm or longer.

On the other hand, if the distance between the orifice plate and the workpiece is too long, then the probability that the beam collides with other molecules is increased. The probability $p(x)$ that the beam travels without colliding with other molecules by at least a distance x is expressed by $$p(x) = \exp(-x/\lambda)$$

where λ represents a mean free path.

According to typical etching conditions, the pressure of the process chamber is 0.1 Pa, and the mean free path λ of the beam is calculated by $\lambda = 50 \times \sqrt{2} = 70$ mm. Therefore, when x=50 mm, p(50)=48.9%. Thus, about half of particles in the beam collide with other molecules and lose energy and directivity. Therefore, it is desirable that the distance between the orifice plate and the workpiece should be 50 mm or shorter.

According to another aspect of the present invention, there is provided an etching apparatus comprising: a workpiece holder for holding a workpiece; a plasma generator for generating a plasma in a vacuum chamber; a first electrode disposed between the workpiece holder and the plasma generator, the first electrode having orifices defined therein; a second electrode disposed upstream of the first electrode in the vacuum chamber; and a voltage applying unit for applying a voltage between the first electrode and the second electrode to accelerate ions from the plasma generated by the plasma generator and to pass the extracted ions through the orifices in the first electrode, for generating a collimated neutral particle beam having an energy ranging from 10 eV to 50 eV.

According to a preferred aspect of the present invention, a distance between the first electrode and the workpiece is set to be in the range from 2 mm to 50 mm.

According to a preferred aspect of the present invention, the pressure of the process chamber is set to be not more than 0.1 Pa.

The above and other objects, features, and advantages of the present invention will be apparent from the following description when taken in conjunction with the accompanying drawings which illustrates preferred embodiments of the present invention by way of example.

BEST MODE FOR CARRYING OUT THE INVENTION

An etching apparatus according to an embodiment of the present invention will be described in detail below with reference to FIGS. 2 through 3B.

Figure 2:
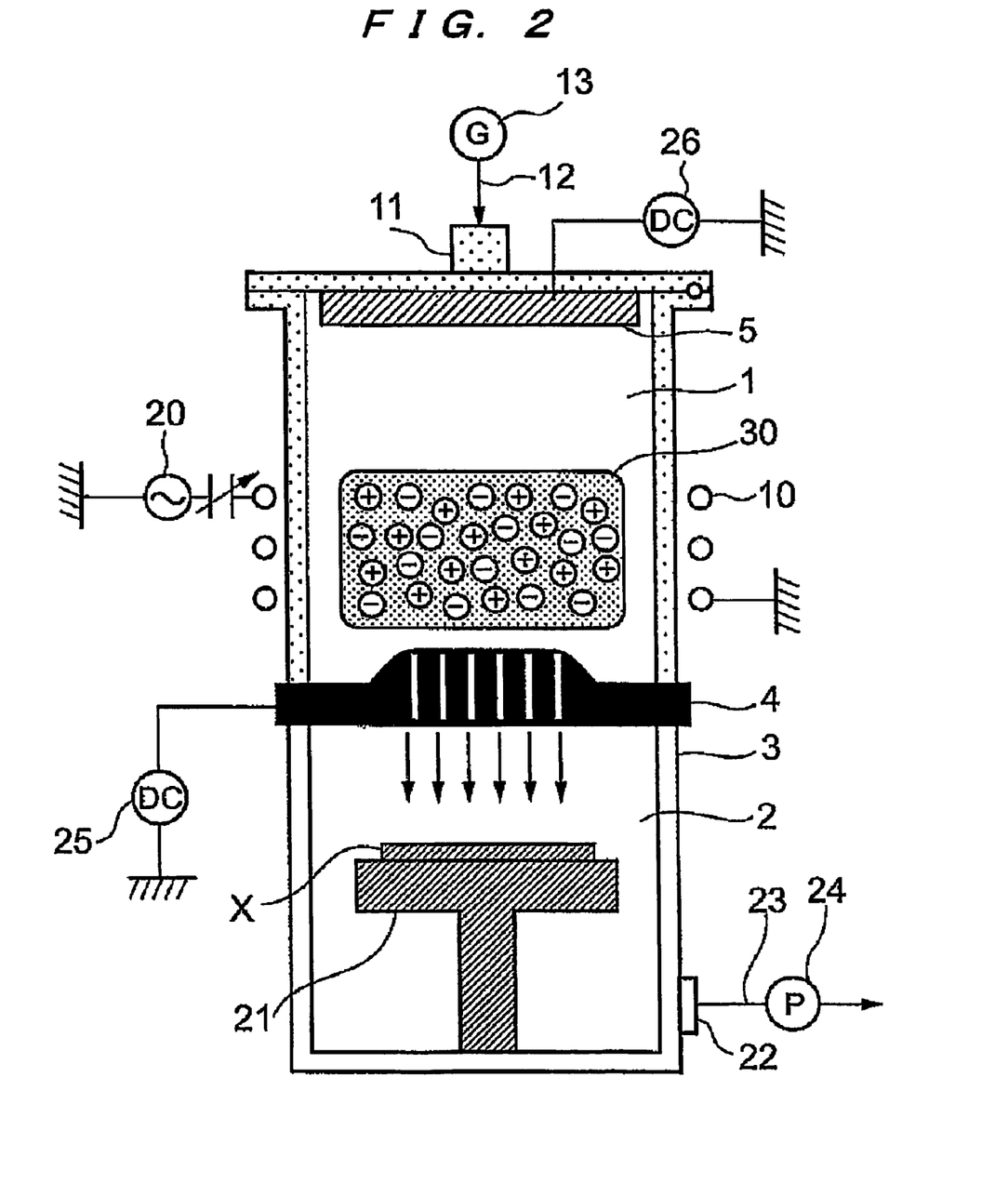
FIG. 2 is a schematic view showing a whole arrangement of an etching apparatus according to an embodiment of the present invention.
Figure 3A:
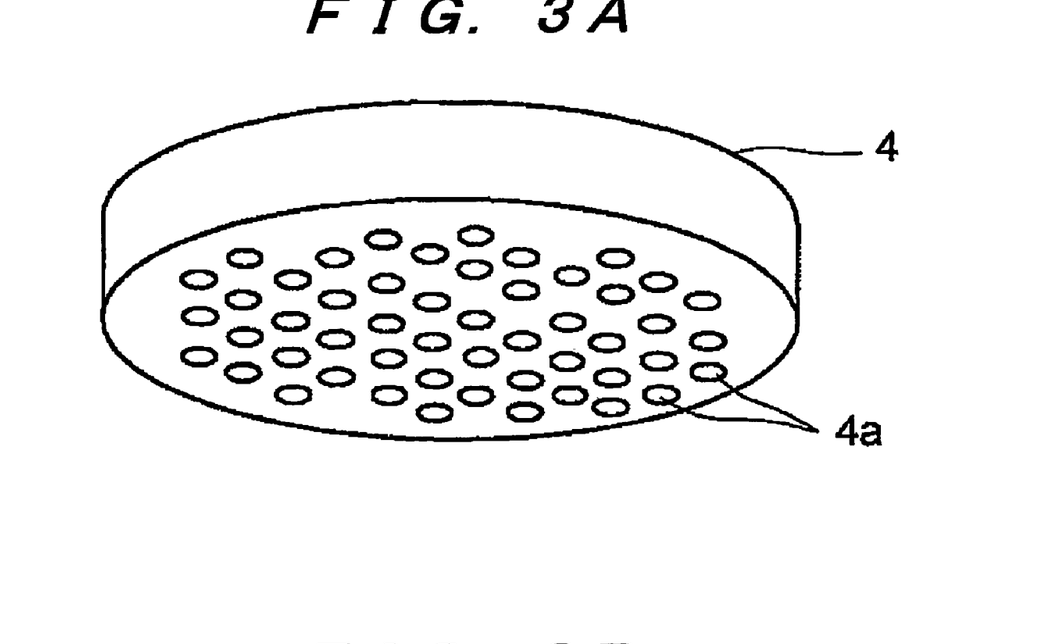
FIG. 3A is a perspective view showing an orifice electrode in the etching apparatus shown in FIG. 2.
Figure 3B:
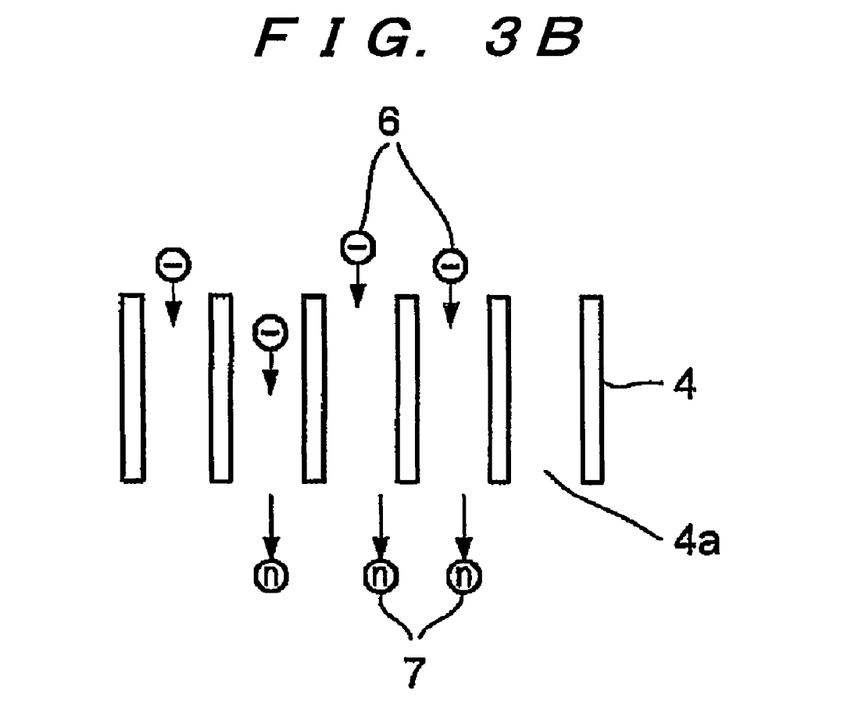
FIG. 3B is a vertical cross-sectional view partially showing the orifice electrode shown in FIG. 3A.

FIG. 2 is a schematic view showing a whole arrangement of an etching apparatus according to an embodiment of the present invention, with electric components in block form. As shown in FIG. 2, the etching apparatus comprises a cylindrical vacuum chamber 3 constituted by a beam generating chamber 1 for generating a neutral particle beam and a process chamber 2 housing therein a workpiece X such as a semiconductor substrate, a glass workpiece, an organic workpiece, or a ceramic workpiece. The beam generating chamber 1 of the vacuum chamber 3 has walls made of quartz glass or ceramics, and the process chamber 2 of the vacuum chamber 3 has walls made of metal.

The beam generating chamber 1 has a coil 10 disposed therearound for inductively coupled plasma (ICP). The coil 10 is housed in a water-cooled tube having an outside diameter of about 8 mm, for example. The coil 10 of about two turns is wound around the beam generating chamber 1. The coil 10 is electrically connected to a high-frequency power supply 20, which applies a high-frequency voltage having a frequency of about 13.56 MHz, for example, to the coil 10. When a high-frequency current is supplied from the high-frequency power supply 20 to the coil 10, an induced magnetic field is produced in the beam generating chamber 1 by the coil 10. The varying magnetic field induces an electric field, which accelerates electrons to generate a plasma 30 in the beam generating chamber 1. Thus, the coil 10 and the high-frequency power supply 20 constitute a plasma generator for generating a plasma 30 in the beam generating chamber 1.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the beam generating chamber 1.

The process chamber 2 houses a workpiece holder 21 therein for holding the workpiece X. The workpiece X is placed on an upper surface of the workpiece holder 21. The process chamber 2 has a gas outlet port 22 defined in a sidewall thereof for discharging the gas from the process chamber 2. The gas outlet port 22 is connected through a gas outlet pipe 23 to a vacuum pump 24, which operates to maintain the process chamber 2 at a predetermined pressure.

An orifice plate (orifice electrode) 4 made of an electrically conductive material such as graphite is disposed as a first electrode in the lower end of the beam generating chamber 1. The orifice electrode 4 is electrically connected to a DC power supply 25. FIG. 3A is a perspective view showing the orifice electrode 4, and FIG. 3B is a vertical cross-sectional view partially showing the orifice electrode 4 shown in FIG. 3A. As shown in FIGS. 3A and 3B, the orifice electrode 4 has a number of orifices 4a defined therein. Typically, the orifice electrode 4 has a number of orifices 4a each having a diameter of 1 mm and a length of 10 mm, and the orifices 4a are arranged with a pitch of 1.4 mm. The beam generating chamber 1 is separated from the process chamber 2 by the orifice plate 4. Therefore, the pressure of the process chamber 2 can be set to be lower than that of the beam generating chamber 1 with the vacuum pump 24.

A thin-plate grid electrode 5 made of an electrically conductive material is disposed as a second electrode in the upper end of the beam generating chamber 1. The grid electrode 5 is electrically connected to a DC power supply 26. The grid electrode 5 may comprise a meshed wire, a punching metal, or the like. Alternatively, the grid electrode 5 may comprise a metal plate having no holes. The DC power supply 25 and the DC power supply 26 constitute a voltage applying unit for applying a voltage between the orifice electrode 4 and the grid electrode 5.

Operation of the etching apparatus according to the present embodiment will be described below.

The vacuum pump 24 is driven to evacuate the vacuum chamber 3, and then a gas such as $SF_6$, $CHF_3$, $CF_4$, $Cl_2$, Ar, $O_2$, $N_2$, or $C_4F_8$ is introduced from the gas supply source 13 into the beam generating chamber 1. A high-frequency voltage having a frequency of about 13.56 MHz is applied to the coil 10 for 50 microseconds by the high-frequency power supply 20, so that a high-frequency electric field is produced in the beam generating chamber 1. The gas introduced into the beam generating chamber 1 is ionized by electrons that are accelerated by the high-frequency electric field, for thereby generating a high-density plasma 30 in the beam generating chamber 1. The plasma 30 is mainly composed of positive ions and heated electrons.

Then, the high-frequency voltage applied by the high-frequency power supply 20 is interrupted for 50 microseconds. Thereafter, the high-frequency voltage is applied again to the coil 10 for 50 microseconds by the high-frequency power supply 20 to heat the electrons in the plasma in the beam generating chamber 1. Thus, the above cycle is repeated. In this manner, the application of the high-frequency voltage for 50 microseconds and the interruption of the high-frequency voltage for 50 microseconds are alternately repeated. The period of time (50 microseconds) for which the high-frequency voltage is interrupted is sufficiently longer than a period of time in which the electrons in the plasma 30 are attached to the residual process gas to generate negative ions, and sufficiently shorter than a period of time in which the electron density in the plasma 30 is lowered to extinguish the plasma. The period of time (50 microseconds) for which the high-frequency voltage is applied is long enough to recover the energy of the electrons in the plasma 30 which has been lowered during the interruption of the high-frequency voltage.

Negative ions can be generated efficiently and continuously by interrupting the high-frequency voltage after the energy of the electrons is increased in the plasma 30. While ordinary plasmas are mostly composed of positive ions and electrons, the etching apparatus according to the present embodiment can efficiently generate a plasma in which positive ions and negative ions coexist therein. Although the high-frequency voltage is interrupted for 50 microseconds in the above example, it may be interrupted for a period of time ranging from 50 to 100 microseconds to generate a large quantity of negative ions as well as positive ions in the plasma.

The DC power supply 25 applies a voltage of −50 V to the orifice plate 4, and the DC power supply 26 applies a voltage −100 V to the grid electrode 5. Accordingly, a potential difference is produced between the orifice electrode 4 and the grid electrode 5 so that orifice electrode 4 serves as an anode and the grid electrode 5 serves as a cathode. Therefore, as shown in FIG. 3B, the negative ions 6 generated in the beam generating chamber 1 are accelerated toward the orifice electrode 4 by the potential difference and introduced into the orifices 4a defined in the orifice electrode 4. Most of the negative ions 6 that are passing through the orifices 4a in the orifice electrode 4 are collided with the sidewall surfaces of the orifices 4a and hence neutralized in the vicinity of solid sidewall surfaces of the orifices 4a, or are collided with gas molecules remaining within the orifices 4a and hence neutralized by charge exchange with the gas molecules. Thus, the negative ions are converted into neutral particles 7.

Thus, the negative ions that have been neutralized when passing through the orifices 4a, i.e., the neutral particles, are then emitted as an energetic beam into the process chamber 2. The neutral particles 7 travel directly in the process chamber 2 and are applied to the workpiece X placed on the workpiece holder 21, for thereby etching the surface of the workpiece X.

The orifice electrode 4 serves not only to neutralize the ions, but also to collimate the neutral particle beam and further to separate the beam generating chamber 1 and the process chamber 2 from each other. The workpiece can highly accurately be etched with the collimated neutral particle beam. Since the beam generating chamber 1 and the process chamber 2 are separated from each other, the pressure of the process chamber 2 can be set to be lower than the pressure of the beam generating chamber 1, so that the accurate etching can be achieved. Further, the orifice electrode 4 which separates the beam generating chamber 1 and the process chamber 2 from each other can prevent a radiation produced by the plasma from being applied to the workpiece X. Specifically, since the beam generating chamber 1 where the plasma is generated is isolated from the workpiece X by the orifice electrode 4, the radiation produced by the plasma is not substantially applied to the workpiece X. Therefore, it is possible to reduce adverse effects on the workpiece X due to the radiation such as an ultraviolet ray which would otherwise damage the workpiece X.

Some charged particles may pass through the orifices 4a in the orifice electrode 4. In order to prevent such charged particles from being applied to the workpiece X, a deflector or an electron trap may be disposed downstream of the orifice electrode 4. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulated workpiece as described above, various processes including an etching process and a deposition process can highly accurately be performed on the insulated workpiece in such a state that an amount of charge build-up is reduced. Various types of gases may be introduced into the beam generating chamber 1 according to the type of process to be performed on the workpiece X. For example, in a dry etching process, oxygen or a halogen gas may selectively be used according to the kind of the workpiece X.

In the above embodiment, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz. The voltages applied to the orifice electrode 4 and the grid electrode 5 are not limited to the above examples.

With the etching apparatus thus constructed, a semiconductor substrate having a diameter of 6 inches was experimentally etched. An Si film having a thickness of 1500 Å was deposited on the surface of the substrate. The beam generating chamber 1 had a diameter of 10 cm and a length of 25 cm. In this experiment, $SF_6$ gas was introduced into the beam generating chamber 1, and the pressures of the beam generating chamber 1 and the process chamber 2 were set to be 1 Pa and 0.1 Pa, respectively. A high-frequency voltage was applied to the coil 10 at intervals of 50 microseconds by the high-frequency power supply 20 to generate the plasma 30. A voltage of −50 V was applied to the orifice electrode 4 by the DC power supply 25, and a voltage of −100 V was applied to the grid electrode 5 by the DC power supply 26. The neutral particle beam was generated from a large amount of negative ions. The orifice electrode 4 had the orifices at an area of 50%, and each of the orifices had a diameter of 1 mm and a length of 10 mm.

Figure 4:
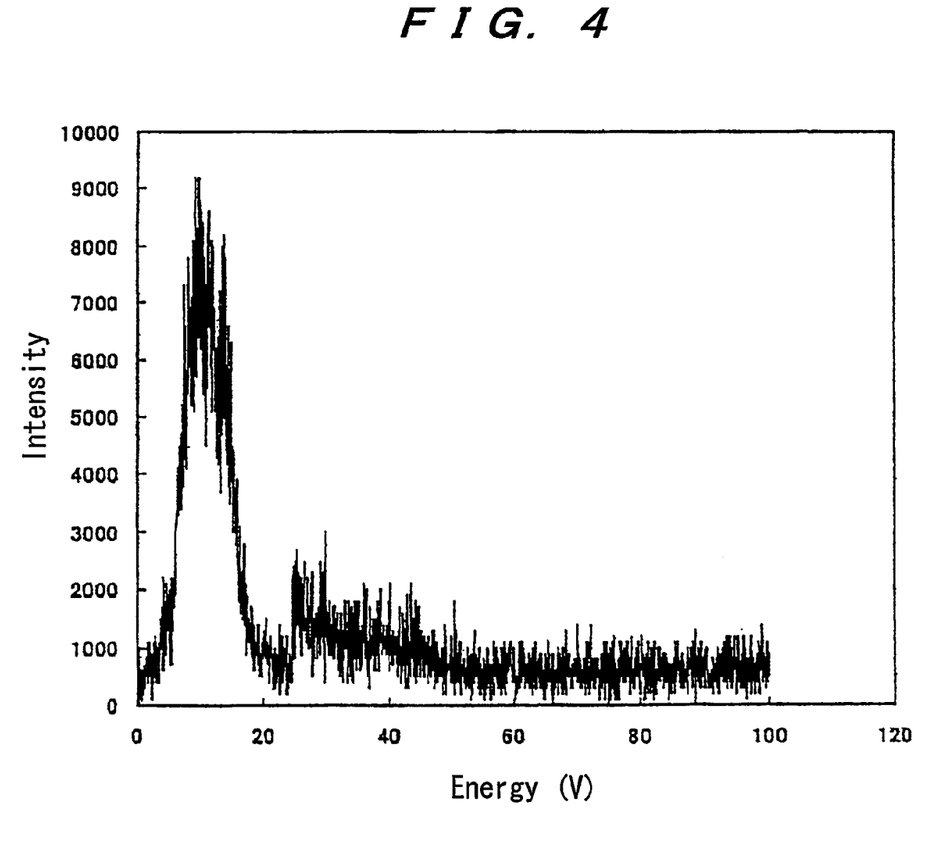
FIG. 4 is a graph showing an energy distribution of a neutral particle beam according to an example of the present invention.

As a result of this experiment, the etching rate was 3000 Å/min, and the selectivity was 400. Thus, good results could be obtained. FIG. 4 shows the energy distribution of the neutral particle beam in this experiment. It can be seen from FIG. 4 that the semiconductor substrate could be etched with a neutral particle beam having a low energy (about 10 eV). When the distance between the orifice electrode 4 and the semiconductor substrate was in the range from 2 mm to 50 mm, particularly when the distance was 20 mm, good results could be obtained.

Although certain preferred embodiments of the present invention have been shown and described in detail, it should be understood that various changes and modifications may be made therein without departing from the scope of the appended claims.

INDUSTRIAL APPLICABILITY

The present invention is applicable to an etching method and apparatus suitable for use in micromachining processes involved in the fabrication of semiconductor devices or the like.

The invention claimed is:
1. An etching method comprising:
  generating a collimated neutral particle beam having an energy ranging from 10 eV to 50 eV from a gas through an orifice plate made of an electrically conductive material, said orifice plate having orifices defined therein; and applying said neutral particle beam to a surface of a workpiece comprising Si and $SiO_2$, which is masked by a resist having a pattern smaller than 0.1 µm, to etch the surface of the workpiece;

wherein said generating comprises neutralizing negative ions by passing said negative ions through said orifices to generate said neutral particle beam said orifices having sidewall surfaces so that said negative ions passing through said orifices are collided with said sidewall surfaces of said orifices and hence neutralized.

2. An etching method according to claim 1, wherein said neutral particle beam includes fluorine atoms or chlorine atoms.

3. An etching method according to claim 1, wherein said gas does not include an additive gas for forming a sidewall passivation layer.

4. An etching method according to claim 1, wherein a distance between said orifice plate and said workpiece is set to be in the range from 2 mm to 50 mm.

5. An etching method according to claim 1, further comprising:

separating a beam generating chamber for generating said neutral particle beam from a process chamber in which said workpiece is disposed; and setting the pressure of said process chamber to be lower than the pressure of said beam generating chamber.

6. An etching method according to claim 5, wherein the pressure of said process chamber is set to be not more than 0.1 Pa.

7. An etching apparatus comprising:

a workpiece holder for holding a workpiece comprising Si and $SiO_2$, which is masked by a resist having a pattern smaller than 0.1 µm;

a plasma generator for generating a plasma in a vacuum chamber;

a first electrode disposed between said workpiece holder and said plasma generator, said first electrode having orifices defined therein;

a second electrode disposed upstream of said first electrode in said vacuum chamber; and a voltage applying unit for applying a voltage between said first electrode and said second electrode to accelerate ions from the plasma generated by said plasma generator and to pass the extracted ions through said orifices in said first electrode, wherein said voltage applying unit is adapted to generate a collimated neutral particle beam having an energy ranging from 10 eV to 50 eV; and wherein said first electrode serves to neutralize negative ions by passing said negative ions through said orifices to generate said neutral particle beam, said orifices having sidewall surfaces so that said negative ions passing through said orifices are collided with said sidewall surfaces of said orifices and hence neutralized.

8. An etching apparatus according to claim 7, wherein a distance between said first electrode and said workpiece is set to be in the range from 2 mm to 50 mm.

9. An etching apparatus according to claim 7, wherein the pressure of said process chamber is set to be not more than 0.1 Pa.

10. An etching apparatus according to claim 7, wherein said first electrode is made of an electrically conductive material.

11. An etching apparatus according to claim 10, wherein a distance between said first electrode and said workpiece is set to be in the range from 2 mm to 50 mm.

12. An etching apparatus according to claim 10, wherein the pressure of said process chamber is set to be not more than 0.1 Pa.

13. An etching method according to claim 1, wherein said negative ions are generated by use of a pulse-time-modulated plasma.

14. An etching method according to claim 5, wherein said negative ions are generated by use of a pulse-time-modulated plasma.

15. An etching method according to claim 1, wherein said orifice plate is thick enough for each of said orifices to have an aspect ratio (L/d), which is a ratio of length (L) to diameter (d) being 10.

16. An etching apparatus according to claim 7, wherein said orifice plate is thick enough for each of said orifices to have an aspect ratio (Lid), which is a ratio of length (L) to diameter (d) being 10.

* * * * *

UNITED STATES PATENT AND TRADEMARK OFFICE
CERTIFICATE OF CORRECTION

| | | |
|---|---|---|
| PATENT NO. | : 7,314,574 B2 | Page 1 of 1 |
| APPLICATION NO. | : 10/484502 | |
| DATED | : January 1, 2008 | |
| INVENTOR(S) | : Katsunori Ichiki et al. | |

It is certified that error appears in the above-identified patent and that said Letters Patent is hereby corrected as shown below:

<u>In Column 9</u>
In claim 1, line 7 change "to generate said neutral particle beam said orifices" to be -- to generate said neutral particle beam, said orifices --

Signed and Sealed this

First Day of July, 2008

JON W. DUDAS
*Director of the United States Patent and Trademark Office*